(12) United States Patent
Niemann et al.

(10) Patent No.: US 11,424,619 B2
(45) Date of Patent: Aug. 23, 2022

(54) ARRANGEMENT HAVING A CONVERTER

(71) Applicant: Siemens Energy Global GmbH & Co. KG, Munich (DE)

(72) Inventors: Bernd Niemann, Erlangen (DE); Martin Pieschel, Altdorf (DE); Markus Naukamm, Erlangen (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 0 days.

(21) Appl. No.: 17/606,119

(22) PCT Filed: Apr. 23, 2019

(86) PCT No.: PCT/EP2019/060347
§ 371 (c)(1),
(2) Date: Oct. 25, 2021

(87) PCT Pub. No.: WO2020/216432
PCT Pub. Date: Oct. 29, 2020

(65) Prior Publication Data
US 2022/0149626 A1  May 12, 2022

(51) Int. Cl.
*H02J 3/18* (2006.01)
*H02M 1/088* (2006.01)
(Continued)

(52) U.S. Cl.
CPC .......... *H02J 3/1857* (2013.01); *H02M 1/088* (2013.01); *H02M 7/483* (2013.01);
(Continued)

(58) Field of Classification Search
CPC ...... H02J 3/1857; H02M 1/088; H02M 7/483; H02M 1/0009; H05K 7/20927; H05K 7/20945
See application file for complete search history.

(56) References Cited

U.S. PATENT DOCUMENTS

2017/0054285 A1* 2/2017 Jin ..................... H02H 3/087
2021/0249970 A1* 8/2021 Pieschel ............ H02M 1/0012

FOREIGN PATENT DOCUMENTS

DE   102016211762 A1   1/2018
WO   WO 2018095549 A1   5/2018

OTHER PUBLICATIONS

Rodriguez J et al.: "Multilevel Converters: An Enabling Technology for High-Power Applications", Proceedings of the IEEE, IEEE. New York, US, vol. 97, No. 11, pp. 1786-1817, XP011278598, ISSN: 0018-9219, DOI: 10.1109/JPROC.2009.2030235, paragraph VI.A, paragraph IV.B; 2009.

* cited by examiner

*Primary Examiner* — Adolf D Berhane
*Assistant Examiner* — Afework S Demisse
(74) *Attorney, Agent, or Firm* — Laurence A. Greenberg; Werner H. Stemer; Ralph E. Locher

(57) ABSTRACT

An arrangement has a converter with an electrical series circuit of modules each having four electronic switching elements and an electrical energy storage device. The arrangement also has a cooling device for cooling the electronic switching elements by way of a liquid coolant and a heat exchanger and a control unit for controlling the electronic switching elements. The control unit controls the electronic switching elements in such a manner that at least one current harmonic is generated in the series circuit if the temperature of the liquid coolant or the temperature of a medium, which is intended to absorb the heat at the heat exchanger, falls below a predetermined limit temperature.

20 Claims, 6 Drawing Sheets

(51) Int. Cl.
 *H02M 7/483* (2007.01)
 *H05K 7/20* (2006.01)
 *H02M 1/00* (2006.01)
(52) U.S. Cl.
 CPC ..... *H05K 7/20927* (2013.01); *H05K 7/20945* (2013.01); *H02M 1/0009* (2021.05)

ARRANGEMENT HAVING A CONVERTER

FIELD AND BACKGROUND OF THE INVENTION

The invention relates to an arrangement having a power converter which has an electrical series circuit of modules each having four electronic switching elements and an electrical energy store. The invention further relates to a method for the operation of such an arrangement.

The electronic switching elements must be cooled during operation of the power converter. The power converter therefore comprises a cooling device that is used to cool the electronic switching elements by means of a liquid coolant and a heat exchanger. The liquid coolant here circulates in a closed cooling circuit. The liquid coolant absorbs heat arising at the electronic switching elements and transports this heat to the heat exchanger. The heat is discharged at the heat exchanger to a temperature-absorbing medium, and the liquid coolant is thereby cooled. The liquid coolant thereupon returns to the electronic switching elements. The medium that accepts the heat at the heat exchanger can, for example, be air.

If the medium that accepts the heat at the heat exchanger has a temperature lower than 0° C., there is a risk that the liquid coolant will freeze and in particular that this will destroy the heat exchanger. To counteract this, an antifreeze can be added to the liquid coolant, for example a glycol (such as in particular monoethylene glycol or propylene glycol). The thermal resistance of the liquid coolant, however, rises as a result of the antifreeze, which means that the heat discharge from the electronic switching elements is impaired. The viscosity of the coolant can also rise as a result of the antifreeze, which also has the consequence of a deterioration in the cooling properties of the cooling device.

SUMMARY OF THE INVENTION

The invention is based on the object of providing an arrangement and a method with which the proportion of antifreeze in the liquid coolant can be reduced.

This object is achieved according to the invention by an arrangement and by a method as claimed in the independent claims. Advantageous forms of embodiment of the arrangement and of the method are given in the dependent claims.

An arrangement having a power converter that comprises an electrical series circuit of modules is disclosed, each module of which comprises four electronic switching elements and an electrical energy store, with a cooling device for cooling the electronic switching elements by means of a liquid coolant and a heat exchanger, and with a drive unit for driving the electronic switching elements which drives the electronic switching elements in such a way that at least one current harmonic (of a fundamental oscillation to be generated by the power converter) is generated in the series circuit when the temperature of the liquid coolant, or the temperature of a medium that is to absorb the heat at the heat exchanger, falls below a preselected (predetermined) limit temperature. The medium that accepts the heat at the heat exchanger (the heat-absorbing medium) can be air, but can also be a liquid. The power converter can, in particular, be a modular, multilevel power converter that is designed, for example, as a reactive power compensator, an inverter, or as an active filter. The power converter can here in particular be designed as a circuit with a delta configuration.

It is advantageous here that the current harmonic is generated in the series circuit as soon as the coolant or the heat-absorbing medium is colder than the preselected limit temperature. As a result of the additionally generated current harmonic, a current flows in the electrical series circuit that causes additional electrical losses in the electronic switching elements. The temperature of the electronic switching elements thereupon rises, and thereby also the temperature of the liquid coolant. Freezing of the liquid coolant is thereby prevented even at a temperature of the heat-absorbing medium below the limit temperature. In other words, the liquid coolant is heated by means of the current harmonic as soon as the temperature of the heat-absorbing medium falls below the limit temperature. As a result it is sufficient if the liquid coolant is given enough antifreeze for it to remain capable of operating down to the limit temperature. Advantageously, the quantity of antifreeze does not have to be calculated for those times (which in general only occur rarely) in which the temperature of the heat-absorbing medium falls below the preselected limit temperature. The electronic switching elements are used as heating elements for these (rare) cases. The four electronic switching elements thus act additionally as heating elements when the temperature of the medium falls below the limit temperature.

The arrangement can be so designed that the preselected limit temperature is the frost protection limit temperature of the coolant. The frost protection limit temperature here is that temperature above which the coolant is liquid. The at least one current harmonic is then generated (thereby employing the electronic switching elements as heating elements) precisely when the temperature of the coolant or the temperature of the heat-absorbing medium falls below the frost protection limit temperature of the coolant. Even with a medium that is this cold, the liquid coolant is thereby prevented from beginning to freeze.

The arrangement can also be so designed that the current harmonic is not a current harmonic that is needed for the compensation of harmonics in a connected alternating voltage grid or in a connected electrical load. The current harmonic is thus exclusively used for heating purposes. The current harmonic is, however, not used for the compensation of harmonics in a connected alternating voltage grid or in a connected electrical load (as would, for example, be conceivable in the case of an active filter).

The arrangement can also be so designed that the current harmonic is an nth order current harmonic (with respect to the fundamental oscillation to be generated by the power converter), where n is an integral multiple of 3. Thus, for example, the "third current harmonic", the "sixth current harmonic", or the "ninth current harmonic" etc. is generated. Current harmonics of this sort are particularly advantageous because it has been found that the currents flowing as a result of these current harmonics remain within the power converter, and do not leave the power converter. As a result, changes resulting from the additional current harmonic do not occur outside the power converter (which means, for example, in the alternating voltage grid connected to the power converter).

The arrangement can be so designed that multiple current harmonics are generated in the series circuit when the temperature of the coolant or the temperature of the medium falls below the preselected limit temperature. In this case, the power converter thus generates multiple different current harmonics. In this variant, harmonics whose order is greater than 3, i.e., for example, the sixth current harmonic, the ninth current harmonic, the twelfth current harmonic and so forth are thus also generated. To generate these current harmonics of higher frequencies, the electronic switching elements must switch more quickly than is, for example, the case when generating the third order harmonic. As a result, greater switching losses occur in the electronic switching elements, so that the liquid coolant is also heated as a result of these switching losses.

The arrangement can also here be so designed that the multiple current harmonics are not current harmonics that are needed for the compensation of harmonics in a connected alternating voltage grid or in a connected electrical load. Here again, these are additional current harmonics that are not necessary for the normal operation of the power converter, or that do not occur in the normal operation of the power converter.

The arrangement can also be so designed that the multiple current harmonics are nth order current harmonics (with respect to the fundamental oscillation to be generated by the power converter) differing from one another, where n is an integral multiple of 3. The third order current harmonic, the sixth order current harmonic and/or the ninth order current harmonic and so forth can thus be generated here, for example.

The arrangement can also be so designed that the power converter comprises three electrical series circuits of modules that are arranged in a delta configuration. In particular, in such a power converter comprising three electrical series circuits in a delta configuration, the currents flowing as a result of the nth order current harmonics (where n is an integral multiple of three) remain within the delta configuration; the currents flowing as a result of these current harmonics do not leave the power converter.

The arrangement can also be so designed that the at least one current harmonic forms a loop current (that does not leave the power converter) flowing within the power converter. This loop current is a (loop) current internal to the power converter, and in particular is only used for heating the liquid coolant.

The arrangement can be so designed that the cooling device is a single-circuit cooling device. Due to the electrical heating of the liquid coolant performed when the temperature of the medium is low, a comparatively simple and economical single-circuit cooling device is sufficient. A multi-circuit cooling device that would use a liquid coolant without, or with only a small amount of, antifreeze in its inner cooling circuit at the four electronic switching elements, and a liquid coolant with more antifreeze (to prevent the liquid coolant of the outer cooling circuit freezing at the heat exchanger of the outer cooling circuit) in an outer cooling circuit, is advantageously not necessary. Such a multi-circuit cooling device would, namely, be associated with significantly greater costs than a single-circuit cooling device.

The arrangement can be so designed that the modules are full-bridge modules in which the four electronic switching elements are arranged in a full-bridge circuit. The current harmonics can be generated particularly easily with such modules.

The arrangement can also be so designed that the electrical series circuit comprises an inductive component in addition to the modules. Such an inductive component makes it possible, in particular, to limit the current rise such that no damage is done to the switching elements by overload.

The arrangement can also be so designed that the at least one current harmonic is only generated when, in addition, the operating current of the power converter flowing (as a result of operation) in the series circuit falls below a current threshold value. The current threshold value is, in particular, the minimum current value that generates a sufficient quantity of heat in the electronic switching elements to prevent the coolant from freezing.

A method is furthermore disclosed for the operation of an arrangement having a power converter that comprises an electrical series circuit of modules, each module of which comprises four electronic switching elements and an electrical energy store, and with a cooling device for cooling the electronic switching elements by means of a liquid coolant and a heat exchanger, wherein, in the method, the temperature of the liquid coolant and/or the temperature of a medium that is to absorb the heat at the heat exchanger is ascertained, and if the temperature of the coolant and/or the temperature of the medium falls below a preselected/predetermined limit temperature, the electronic switching elements are driven such that at least one current harmonic (with respect to the fundamental oscillation to be generated by the power converter) is generated in the series circuit.

This method can proceed such that the current harmonic is an nth order current harmonic (with respect to the fundamental oscillation to be generated by the power converter), where n is an integral multiple of 3.

The method can also proceed such that multiple current harmonics (with respect to the fundamental oscillation to be generated by the power converter) are generated in the series circuit when the temperature of the coolant or the temperature of the medium falls below the preselected limit temperature.

The method can proceed such that the multiple current harmonics are not current harmonics that are needed for the compensation of harmonics in a connected alternating voltage grid or in a connected electrical load.

The method can also proceed such that the multiple current harmonics are nth order current harmonics (with respect to the fundamental oscillation to be generated by the power converter) differing from one another, where n is an integral multiple of 3.

The method can proceed such that as a result of the at least one current harmonic, a loop current flowing within the power converter (that does not leave the power converter) is formed.

The method can also proceed such that the at least one current harmonic is only generated in the series circuit when, in addition, the operating current of the power converter flowing (as a result of operation) in the series circuit falls below a current threshold value.

The arrangement described with the power converter and the method described have the same or similar advantages.

The invention is explained in more detail below with reference to exemplary embodiments. The same reference signs here refer to elements that are the same or that act in the same way.

DETAILED DESCRIPTION OF THE INVENTION

Figure 1:
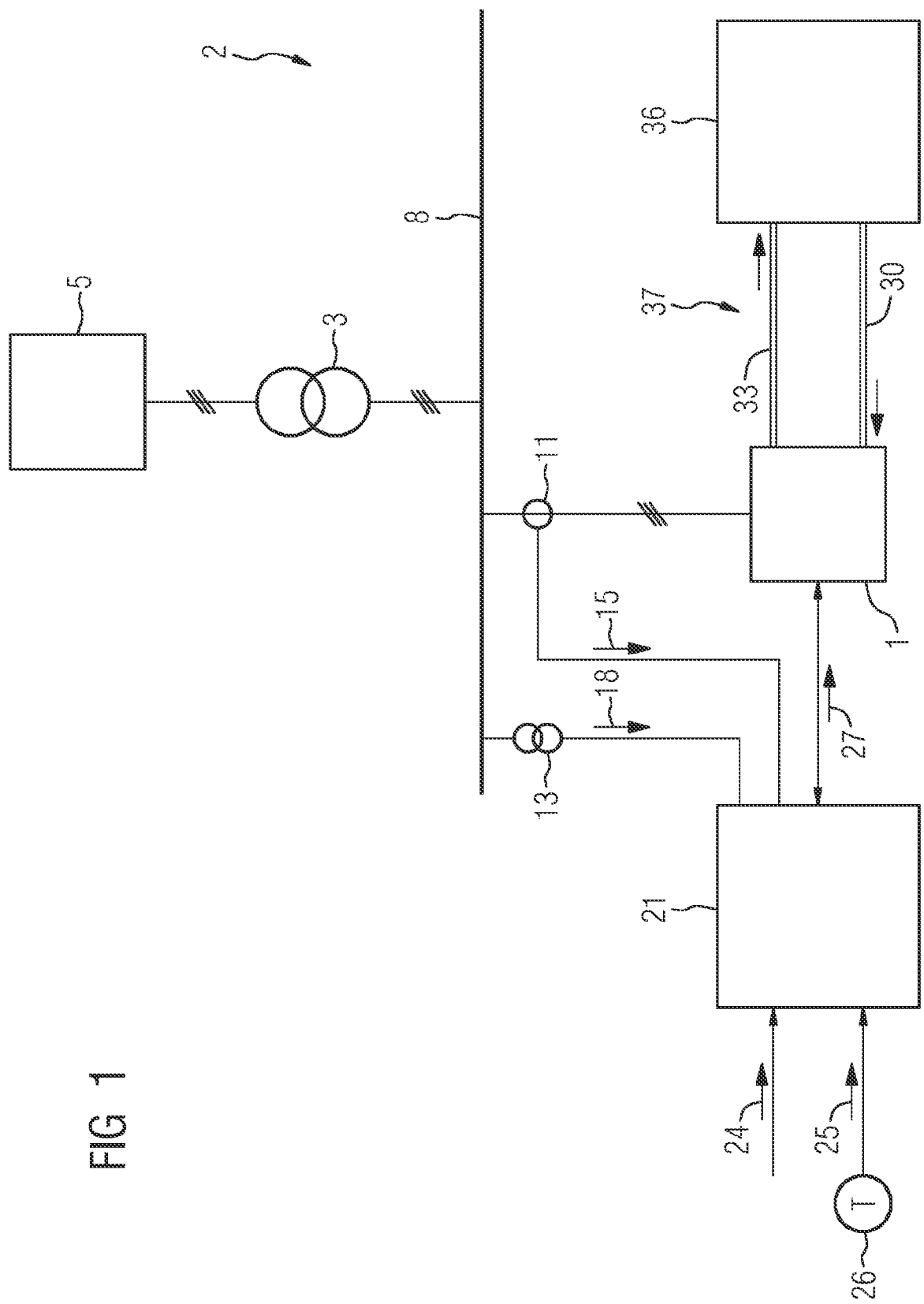
FIG. 1 shows an exemplary embodiment of an arrangement with a power converter that is connected to an energy supply grid.

An arrangement 2 with a power converter 1 that is connected via a transformer 3 to a three-phase electric alternating voltage grid 5 (energy supply grid 5) is shown in FIG. 1. A three-phase electric connection is established between the power converter 1 and the transformer 3 by means of a connecting rail 8. A current sensor 11 serves to measure the current flowing to the power converter 1. A voltage sensor 13 measures the voltage present at the connecting rail 8; this voltage corresponds to the voltage present at the power converter 1. Measured current values 15 of the current sensor 11 and measured voltage values 18 of the voltage sensor 13 are transmitted to a drive unit 21. The drive unit 21 generates drive signals 27 on the basis of these measured values 15 and 18, of setpoint values 24, and of measured temperature values 25 (that originate from a temperature sensor 26), and thereby controls the power converter 1. The drive unit 21 processes the measured current values 15, the measured voltage values 18 and the measured temperature values 25 for this purpose. In the exemplary embodiment of FIG. 1, the power converter 1 is a reactive power compensator which can precisely influence the reactive power arising in the connecting rail 8, and thereby also in the alternating voltage energy supply grid 5. The power converter 1 is designed in the exemplary embodiment as a modular multilevel power converter 1.

The power converter 1 is connected to a cooling device 36 via a coolant feed 30 and a coolant return 33. A coolant 37 circulates in the closed coolant circuit. The coolant 37 is designed as a liquid coolant (cooling liquid), in particular as a water-based liquid coolant such as, for example, deionized water. The measured temperature values 25 in the exemplary embodiment are measured values of the temperature of a medium that is to absorb the heat at a heat exchanger 76 (compare FIG. 7) of the cooling device 36. Alternatively or in addition, the measured temperature values 25 can also be measured values of the temperature of the liquid coolant 37 (in particular measured values of the temperature of the liquid coolant at the heat exchanger 76).

Figure 2:
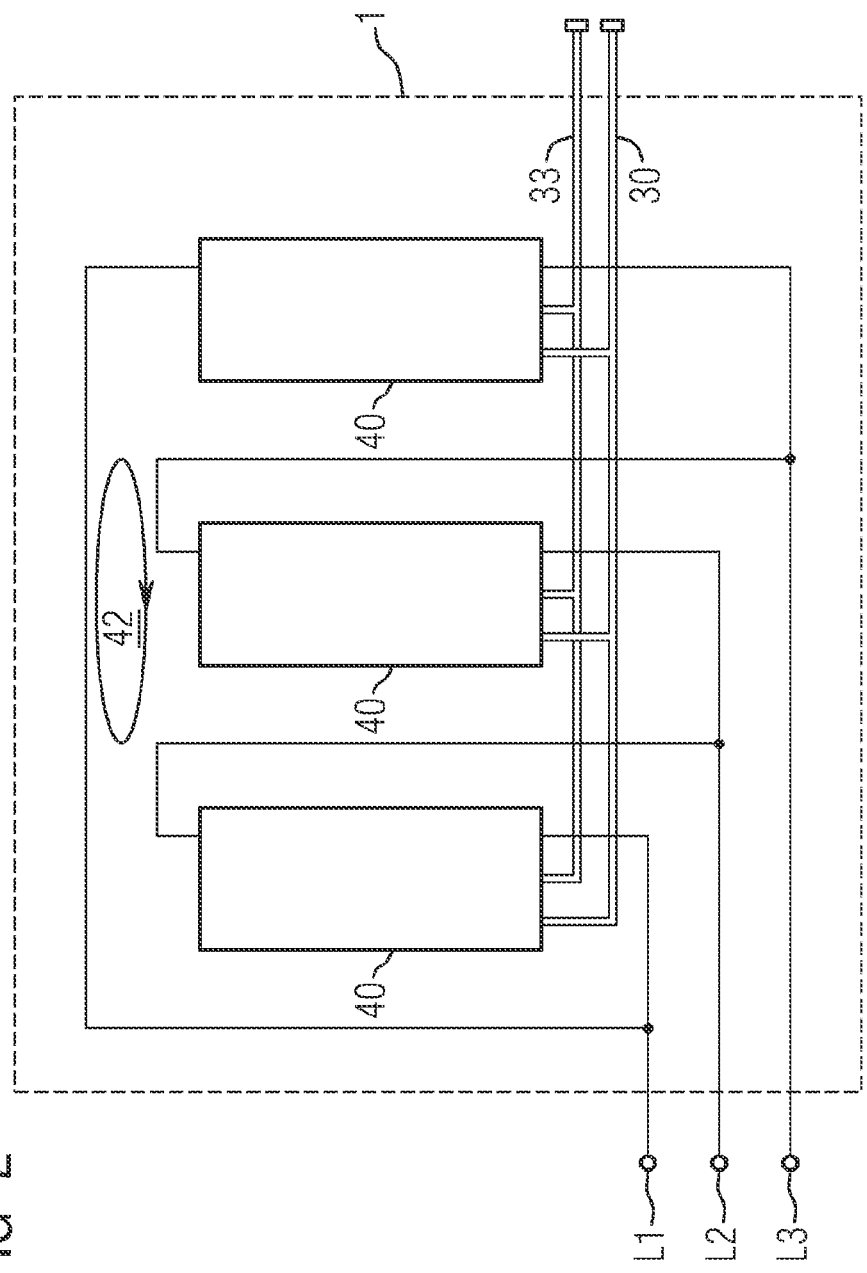
FIG. 2 shows an exemplary embodiment of the power converter designed as a delta configuration.

An exemplary embodiment of the power converter 1 that comprises three power converter paths 40 is illustrated in FIG. 2. The three power converter paths 40 are connected in a delta configuration and can be connected via three power converter terminals L1, L2 and L3 to the three phases of the three-phase alternating voltage grid 5. Each power converter path 40 is connected to the cooling device 36 via the coolant feed 30 and the coolant return 33. In the power converter 1 (here: in the delta configuration of the three power converter paths 40) a loop current 42 that does not leave the power converter 1 can flow.

Figure 3:
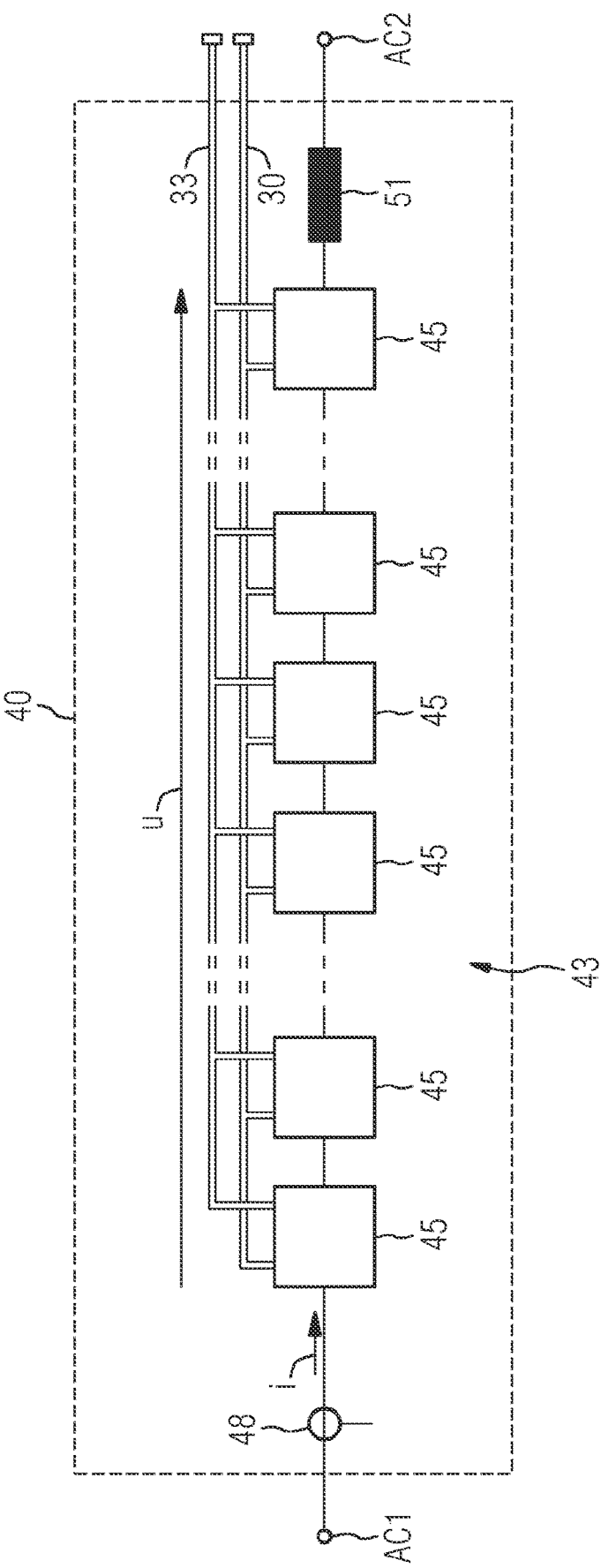
FIG. 3 shows an exemplary embodiment of a phase module of the power converter.

An exemplary embodiment of a power converter path 40 is illustrated in FIG. 3. This power converter path 40 comprises a first path terminal AC1 and a second path terminal AC2. An electrical series circuit 43 of modules 45 extends between the two path terminals AC1 and AC2. The series circuit 43 optionally further comprises a current sensor 48 for measuring the current i flowing through the power converter path 40, and an inductive component 51 (in particular a coupling inductor 51). The voltage u appears over the series circuit 43 of modules 45. Each module 45 is connected to the cooling device 36 via the coolant feed 30 and the coolant return 33.

The power converter path in the exemplary embodiment can, for example, comprise 64 modules. In other exemplary embodiments, the power converter path can, of course, also comprise a different number of modules, for example 32 modules or 128 modules. The power converter path 40 can also be referred to as a power converter module 40.

Figure 4:
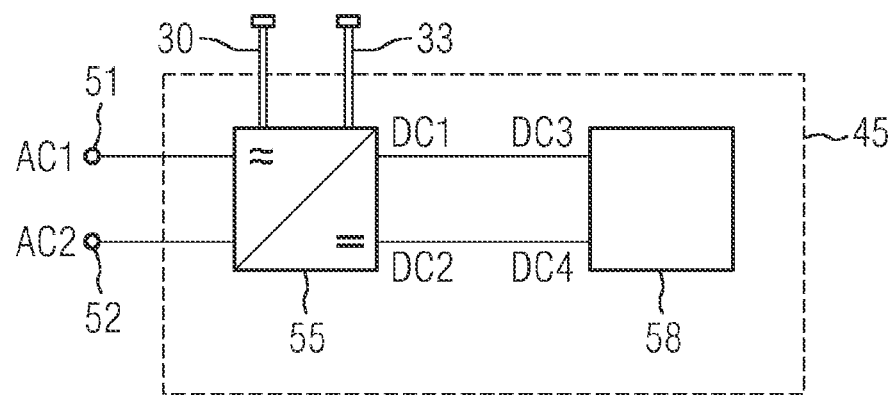
FIG. 4 shows an exemplary embodiment of a module of the electrical series circuit of the power converter.

An exemplary embodiment of a module 45 is illustrated in FIG. 4. The module 45 comprises two module terminals 51 and 52, which are connected to what is known as a power module 55. The power module 55 further comprises two direct voltage terminals DC1 and DC2 which are electrically connected to two direct voltage terminals DC3 and DC4 of a capacitor module 58. The direct voltage terminals DC1 and DC2 form a DC link of the module 45. The power module 55 is connected to the cooling device 36 via the coolant feed 30 and the coolant return 33.

Figure 5:
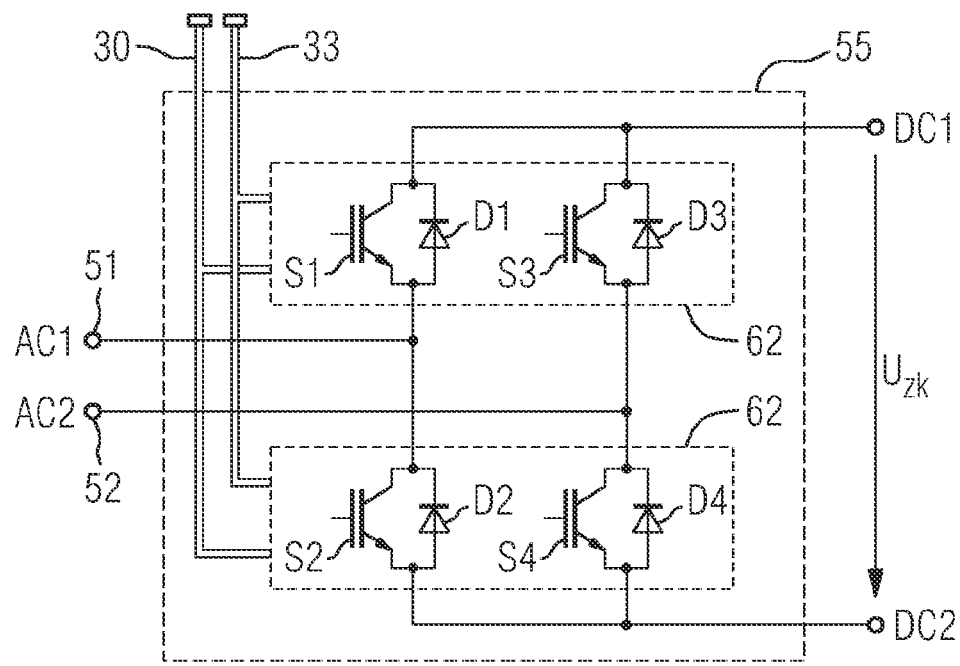
FIG. 5 shows an exemplary embodiment of a power module that forms a part of the module of the series circuit.

An exemplary embodiment of the power module 55 is illustrated in FIG. 5. The power module 55 comprises four electronic switching elements S1-S4 (in particular semiconductor switches S1-S4). The power module can also be referred to as a switching element module 55. The four electronic switching elements S1-S4 are arranged in a full-bridge circuit. A freewheeling diode D1-D4 is connected antiparallel with each of the electronic switching elements S1-S4. The electronic switching elements can, for example, be IGBTs, IGCTs, IEGTs or MOSFETs. It can be seen in FIG. 5 that the DC link voltage UZK occurs at the terminals DC1 and DC2.

Each of the electronic switching elements S1-S4 is thermally connected to a heat sink 62 (for example to a cooling plate 62). The heat sink 62 absorbs the heat arising in the electronic switching elements (in particular as a result of electrical losses). The heat sink 62 passes this heat to the liquid coolant 37 which is supplied via the coolant feed 30 of the cooling device 36. The heated coolant is then transported via the coolant return 33 to the cooling device 36.

Figure 6:
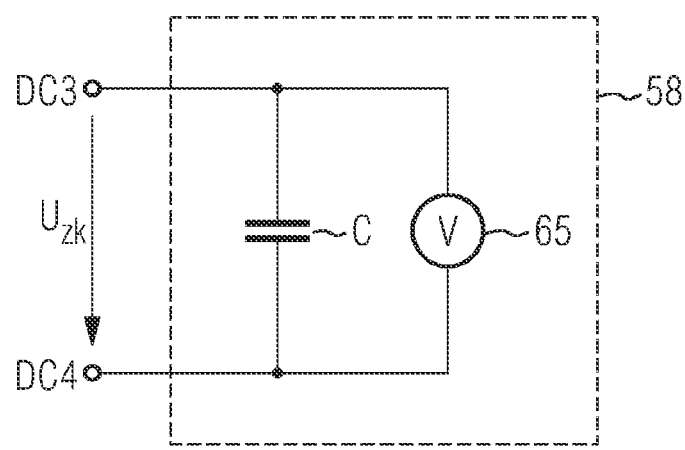
FIG. 6 shows an exemplary embodiment of a capacitor module that forms a part of the module of the series circuit.

An exemplary embodiment of the capacitor module 58 is illustrated in FIG. 6. The capacitor module 58 comprises a capacitor C (which functions as an intermediate store for electrical energy and, in particular, buffers the DC link voltage UZK) as an energy store, and, optionally, a voltage measuring device 65 connected in parallel with the capacitor C.

Figure 7:
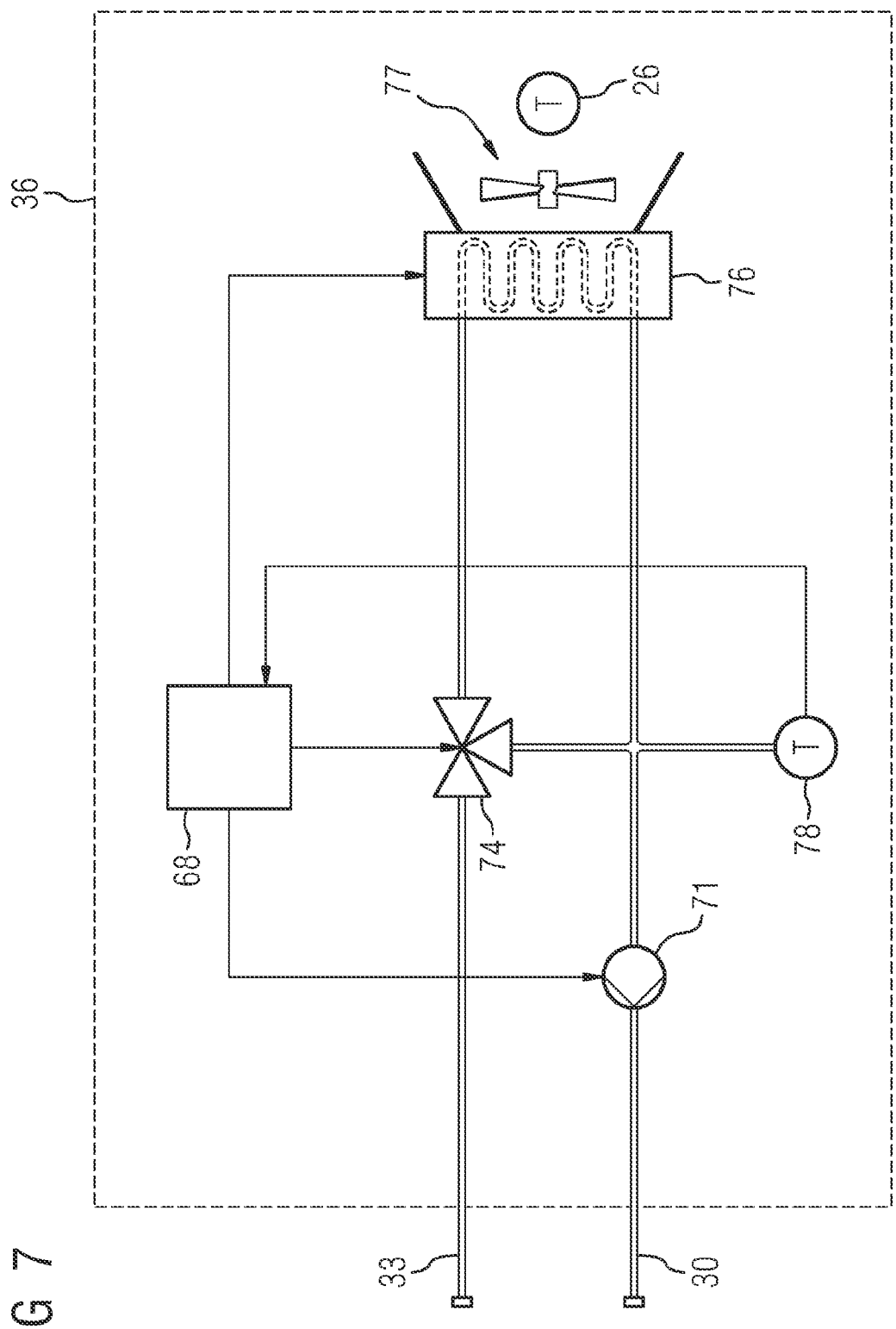
FIG. 7 shows an exemplary embodiment of a cooling device in the form of a single-circuit cooling device.

An exemplary embodiment of the cooling device 36 (cooling installation 36) is illustrated in FIG. 7, designed, by way of example, as a single-circuit cooling device 36. The cooling device 36 comprises a cooling device controller 68, a pump 71, a three-way valve 74 and a heat exchanger 76. The cooling device controller 68 controls the pump 71 which pumps the coolant through the cooling circuit to the electronic switching elements S1-S4 (circulation of the liquid coolant). The cooling device controller 68 also controls the three-way valve 74. The cooling device controller 68 thus controls the quantity of coolant 37 flowing to the heat exchanger 76.

The heat exchanger 76 is in thermal contact with a medium 77 that is to absorb the heat released from the heat exchanger. This medium 77 absorbing the heat at the heat exchanger is air (ambient air) in the exemplary embodiment. In other exemplary embodiments, however, a different medium can be used, such as a liquid.

The heat exchanger 76 comprises an electrical fan that is driven by the cooling device controller 68. The fan transports the air through the heat exchanger or along the heat exchanger; the air now absorbs the heat from the liquid coolant. The temperature of the coolant is measured by means of a temperature sensor 78; the measured coolant temperature is evaluated by the cooling device controller 68.

The temperature sensor 26 is also illustrated (cf. FIG. 1). In the example, the temperature sensor 26 measures the temperature of the heat-absorbing medium at the heat exchanger 76 (the temperature, in this case, of the air surrounding the heat exchanger). Alternatively or in addition, the temperature of the coolant can also be measured, in particular the temperature of the coolant at the heat exchanger 76.

Figure 8:
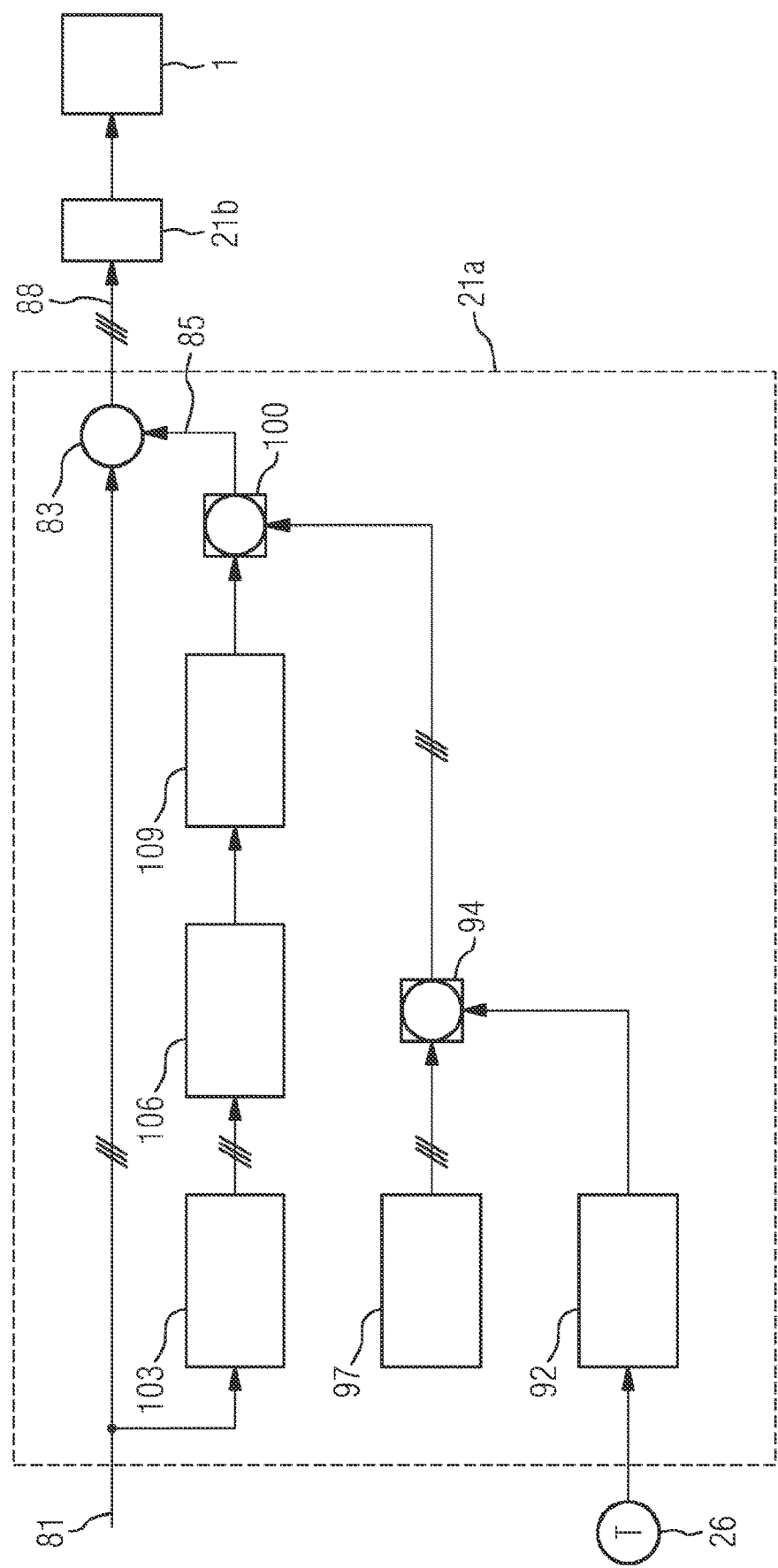
FIG. 8 shows an exemplary embodiment of a harmonic unit.

An exemplary embodiment of a harmonic unit 21*a* is illustrated in FIG. 8; it, and a current control unit 21*b*, are component parts of the drive unit 21 for the power converter 1. The harmonic unit 21*a* can also be referred to as a harmonic generation unit.

The harmonic unit 21*a* receives a three-phase current demand signal 81 that describes the current that the power converter 1 is to provide. Under certain conditions (that are explained below in more detail), a harmonic signal 85 is added to the current demand signal 81 at a summation point 83; a current setpoint value signal 88 results, and is transferred to the three-phase current control unit 21*b*.

The temperature measured by the temperature sensor 26 (in this case the temperature of the heat-absorbing medium at the heat exchanger, or the temperature of the coolant at the heat exchanger) is compared in a comparator 92 with the preselected limit temperature. The preselected limit temperature is, in particular, the frost protection limit temperature of the coolant.

If the temperature measured by the temperature sensor 26 is the same as or lower than the preselected limit temperature, then a "1" signal is output at the output of the comparator 92, and otherwise a "0" signal is output. This output signal of the comparator 92 is supplied to one input of a multiplier 94. A second input of the multiplier 94 is connected to one output of a function generator 97. The three-phase function generator 97 generates three sinusoidal oscillations with a frequency that corresponds to an integral multiple of three times the frequency of a fundamental oscillation. The fundamental oscillation is, in particular, the fundamental oscillation to be generated by the power converter. The frequency of the fundamental oscillation can here correspond to the grid frequency of the electrical energy supply grid 5. The sinusoidal oscillations that are generated form the stipulated value for the current harmonics to be generated in the power converter (for heating purposes). The three sinusoidal oscillations that are generated have a phase offset of 120° with respect to one another.

Thus the stipulated value for the sinusoidal oscillations to be generated, or the "0" signal, is thus provided at the output of the multiplier 94. The output of the multiplier 94 is supplied to an input of a further multiplier 100.

The RMS value is formed in an RMS value former 103 for each phase from the three-phase current demand signal 81. The smallest RMS value is then ascertained in a minimum former 106 from the three RMS values. The comparator 109 (threshold value former 109) downstream of the minimum former 106 provides a "1" signal at its output if the smallest RMS current is smaller than a current threshold value. The current threshold value describes an electrical current that leads to exactly the electrical losses (and the heat generation associated therewith) in the power converter that are sufficient to prevent freezing of the coolant. These losses can be referred to as "necessary losses". The output signal of the comparator 109 is supplied to a further input of the further multiplier 100.

The output signal of the further multiplier 100 (harmonic signal 85) describes the additional current that must flow in the power converter in order to generate additional electrical losses and thereby to heat up the coolant. The output signal of the further multiplier 100 is added at the summation point 83 to the current demand signal 81; the current setpoint value signal 88 results. The three-phase current setpoint value signal is then supplied to the current controller 21*b*. The elements 103, 106, 109 and 100 are optional, and they can also be omitted. The output signal of the multiplier 94 is then passed directly to the summation point 83.

The following method is followed for operation of the described arrangement or the described power converter: The temperature of the liquid coolant 37 or the temperature of the medium 77 that is to absorb the heat at the heat exchanger 76 is ascertained. When the temperature of the coolant 37 or the temperature of the medium 77 falls below a preselected limit temperature, the electronic switching elements S1, S2, S3 and S4 are driven such that at least one current harmonic is generated in the series circuit 43. This current harmonic is an nth order current harmonic, where n is an integral multiple of 3. Multiple current harmonics can also be generated in the series circuit 43 when the temperature of the coolant 37 or the temperature of the medium 77 falls below the preselected limit temperature. The multiple current harmonics are nth order current harmonics, different from one another, where n is an integral multiple of 3.

The at least one current harmonic here is not provided to compensate harmonics in the connected alternating voltage grid 5 or in a connected electrical load, but (in particular exclusively) to heat up the liquid coolant. Due to the at least one current harmonic, a loop current 42 that does not leave the power converter flows within the power converter 1. This loop current is a current internal to the power converter. Due to the formation of the current harmonics and/or as a result of the loop current flowing, an electrical power loss, which heats the coolant, occurs in the electronic switching elements. In this way, freezing of the coolant (in particular in the heat exchanger 76) is reliably prevented even at low outside temperatures/temperatures of the heat-absorbing medium. Optionally, the at least one current harmonic in the series circuit 43 can only be generated when, in addition, the operating current of the power converter 1 flowing in the series circuit 43 falls below a current threshold value. In this case the operating current is not alone sufficient to adequately heat the coolant. The additional current harmonic/current harmonics and the associated additional loop current are generated for this reason.

An arrangement with a power converter and a method have been described with which a power converter can be operated even at very low outside temperatures with a comparatively low proportion of antifreeze in the liquid coolant. This in particular allows operation of a three-phase multilevel power converter in a delta configuration with a single-circuit cooling installation at very low outside temperatures.

The power converter can operate here as, for example, a reactive power compensator (in particular as a static synchronous compensator-STATCOM). Such a reactive power compensator is namely generally only rarely operated at full load (i.e. with the full reactive power output); rather does it usually operate in a low-loss idling mode. For this reason the described method and the described arrangement can be particularly advantageously utilized here.

The described method and the described arrangement in particular enable the operation of a three-phase multilevel power converter in a delta configuration with a single-circuit cooling installation that uses a lower proportion of antifreeze than the lowest outside temperatures to be expected would require. When outside temperatures are below the frost protection limit temperature of the coolant, a current harmonic is generated by the power converter here in the power converter idling mode whose order is an integral multiple of 3. This current harmonic is preferably selected such that the additional losses it generates in the power converter correspond to about 10% of the rated power converter losses. It has, surprisingly, namely been found that the coolant with what is actually too low a proportion of antifreeze does not then freeze, but that an ice slurry forms that can be kept liquid by means of the heating resulting from the current harmonics. In this way damage to the heat exchanger through ice formation can even be prevented when the outside temperatures lie below the freezing point of the coolant.

In one special embodiment, multiple current harmonics that are integral multiples of the third order are generated in order to generate a small RMS current in the power converter that necessitates a high switching frequency in the modules of the multilevel power converter.

The arrangement with the power converter and the method have a range of advantages:

only low pressure losses arise in the cooling device since, due to the low proportion of antifreeze, the liquid coolant only has a relatively low viscosity, the cooling device can be realized economically, in particular as a single-circuit cooling device, since the heat can be effectively drawn away from the electrical switching elements of the power converter, good thermal utilization of the power converter is possible; reducing the power of the power converter as a result of overheating is avoided, also, due to the lower temperature of the cooled electronic switching elements, only low electrical operating losses occur in the power converter; only a small heat exchanger/re-cooler is required, and a better loss rating of the power converter is possible and/or the additional (intentional) electrical losses in the power converter (electrical heating losses) only occur on very few cold days (for example on days with temperatures below −40° C.)

Advantageously, the use of a coolant with a lower antifreeze proportion than the lowest conceivable outside temperatures would require is enabled. If the outside temperatures fall below the frost protection limit, a harmonic current is generated in the power converter that does not flow into the grid and that generates sufficient electrical losses to heat up the coolant. It is in addition possible, by means of a controlled intermixing of hot and cold coolant, to ensure even more effectively that the coolant remains liquid.

By selecting a higher limit temperature, the proportion of antifreeze in the coolant can be reduced even further, and the operating losses of the power converter can be reduced further due to the viscosity of the coolant. Even smaller and more economical re-coolers/heat exchangers are then sufficient.

Expensive alternatives such as, for example, using a dual-circuit cooling installation, a single-circuit cooling installation with a higher proportion of antifreeze and a reduction in the power of the power converter, or a single-circuit cooling installation with a separate auxiliary heater are advantageously avoided. These expensive alternatives are outlined briefly below.

1. Addition of a high proportion of antifreeze (e.g. monoethylene glycol or propylene glycol, or in general: glycol), which impairs the thermal exploitation of the power semiconductor switching elements and, at very low outside temperatures, for example below −40° C., scarcely enables useful operation due to the necessary power reduction.

2. Use of an auxiliary heater (electrical or with fuel), that keeps the coolant above the freezing point. This, however, requires expensive additional devices with expensive power supply.

3. Splitting the cooling circuit into two cooling circuits that are coupled via an additional heat exchanger, wherein the inner circuit cools the power converter without antifreeze, and the outer circuit, with a very high proportion of antifreeze, couples the open-air heat exchanger to the ambient air. Due to the expensive doubling of heat exchangers, pumps and sensors, additionally high operating losses occur in the cooling installation, and the expense of servicing rises.

The invention claimed is:

1. An arrangement, comprising:
   a power converter having an electrical series circuit of modules, with each of said modules having four electronic switching elements and an electrical energy storage device;
   a cooling device for cooling the electronic switching elements with a liquid coolant and a heat exchanger; and
   a drive unit for driving the electronic switching elements, said drive unit being configured to drive said electronic switching elements to generate at least one current harmonic in said series circuit when a temperature of the liquid coolant, or a temperature of a medium for absorbing heat at said heat exchanger, falls below a predetermined limit temperature;
   wherein the at least one current harmonic is not a current harmonic that is needed for a compensation of harmonics in a connected alternating voltage grid or in a connected electrical load.

2. The arrangement according to claim 1, wherein the predetermined limit temperature is the frost protection limit temperature of the coolant.

3. The arrangement according to claim 1, wherein the at least one current harmonic is one of a plurality of current harmonics generated in the series circuit when the temperature of the coolant or of the medium falls below the predetermined limit temperature.

4. The arrangement according to claim 1, wherein said power converter comprises three electrical series circuits of modules configured as a delta circuit.

5. The arrangement according to claim 1, wherein the at least one current harmonic forms a loop current flowing within said power converter.

6. The arrangement according to claim 1, wherein said cooling device is a single-circuit cooling device.

7. The arrangement according to claim 1, wherein said modules are full-bridge modules in which four electronic switching elements are arranged in a full-bridge circuit.

8. The arrangement according to claim 1, wherein said electrical series circuit comprises an inductive component in addition to said modules.

9. The arrangement according to claim 1, wherein the at least one current harmonic in said series circuit is only generated when, in addition, an operating current of the power converter flowing in said series circuit falls below a current threshold value.

10. An arrangement, comprising:
a power converter having an electrical series circuit of modules, with each of said modules having four electronic switching elements and an electrical energy storage device;
a cooling device for cooling the electronic switching elements with a liquid coolant and a heat exchanger; and
a drive unit for driving the electronic switching elements, said drive unit being configured to drive said electronic switching elements to generate at least one current harmonic in said series circuit when a temperature of the liquid coolant, or a temperature of a medium for absorbing heat at said heat exchanger, falls below a predetermined limit temperature;
wherein the at least one current harmonic is an nth order current harmonic, with n being an integral multiple of 3.

11. The arrangement according to claim 10, wherein the at least one current harmonic is one of a plurality of current harmonics generated in the series circuit when the temperature of the coolant or of the medium falls below the predetermined limit temperature.

12. The arrangement according to claim 11, wherein the multiple current harmonics are not current harmonics that are needed for a compensation of harmonics in a connected alternating voltage grid or in a connected electrical load.

13. The arrangement according to claim 11, wherein the multiple current harmonics are nth order current harmonics, different from one another, where n is an integral multiple of 3.

14. A method for operating an arrangement with a power converter having an electrical series circuit of modules, with each module including four electronic switching elements and an electrical energy storage device, and having a cooling device for cooling the electronic switching elements by way of a liquid coolant and a heat exchanger, the method comprising:
ascertaining a temperature of the liquid coolant or a temperature of a medium that is to absorb heat at the heat exchanger; and
when the temperature of the coolant or the temperature of the medium falls below a predetermined limit temperature, driving the electronic switching elements so as to generate at least one current harmonic in the series circuit, the at least one current harmonic being an nth order current harmonic, with n being an integral multiple of 3.

15. The method according to claim 14, which comprises generating multiple current harmonics in the series circuit when the temperature of the coolant or of the medium falls below the predetermined limit temperature.

16. The method according to claim 14, wherein the multiple current harmonics are not current harmonics that are needed for a compensation of harmonics in a connected alternating voltage grid or in a connected electrical load.

17. The method according to claim 14, wherein the multiple current harmonics are nth order current harmonics, different from one another, where n is an integral multiple of 3.

18. The method according to claim 14, which comprises generating the at least one current harmonic in the series circuit only when, in addition, an operating current of the power converter flowing in the series circuit falls below a current threshold value.

19. A method for operating an arrangement with a power converter having an electrical series circuit of modules, with each module including four electronic switching elements and an electrical energy storage device, and having a cooling device for cooling the electronic switching elements by way of a liquid coolant and a heat exchanger, the method comprising:
ascertaining a temperature of the liquid coolant or a temperature of a medium that is to absorb heat at the heat exchanger; and
when the temperature of the coolant or the temperature of the medium falls below a predetermined limit temperature, driving the electronic switching elements so as to generate at least one current harmonic in the series circuit, wherein, due to the at least one current harmonic, a loop current is formed flowing within the power converter.

20. The method according to claim 19, which comprises generating multiple current harmonics in the series circuit when the temperature of the coolant or of the medium falls below the predetermined limit temperature.

* * * * *